US012727250B2

(12) United States Patent
Chiu et al.

(10) Patent No.: US 12,727,250 B2
(45) Date of Patent: Sep. 1, 2026

(54) ELECTRONIC DEVICE

(71) Applicant: Innolux Corporation, Miaoli County (TW)

(72) Inventors: Wei-Yen Chiu, Miaoli County (TW); Yi-Hsiu Wu, Miaoli County (TW); Chia-Hao Tsai, Miaoli County (TW); Yung-Hsun Wu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 384 days.

(21) Appl. No.: 18/430,655

(22) Filed: Feb. 2, 2024

(65) Prior Publication Data

US 2024/0297180 A1 Sep. 5, 2024

Related U.S. Application Data

(60) Provisional application No. 63/449,317, filed on Mar. 2, 2023.

(30) Foreign Application Priority Data

Sep. 22, 2023 (CN) ........................ 202311233698.7

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01)

(58) Field of Classification Search
CPC .................. H10D 86/60; H10D 86/441; G02F 1/134309; G02F 1/136209
See application file for complete search history.

(56) References Cited

U.S. PATENT DOCUMENTS

2005/0117103 A1* 6/2005 Son .................. G02F 1/136286 349/141
2008/0284967 A1* 11/2008 Oh .................. G02F 1/134363 438/30
2009/0323005 A1* 12/2009 Ota .................. G02F 1/13439 349/143
2011/0037931 A1* 2/2011 Im .................. G02F 1/133512 349/187
2019/0259781 A1* 8/2019 Wang .................. H10D 86/441

FOREIGN PATENT DOCUMENTS

CN 107145012 1/2021
TW M578395 5/2019

* cited by examiner

*Primary Examiner* — Mark W Tornow
(74) *Attorney, Agent, or Firm* — JCIPRNET

(57) ABSTRACT

An electronic device including a substrate, a data line, a transparent conductive layer, a first light-shielding layer, and a second light-shielding layer is provided. The data line is disposed on the substrate. The transparent conductive layer is disposed on the data line and has a slit, wherein the slit has a trunk portion, and the trunk portion is extended in a first direction. The first light-shielding layer is disposed on the data line and overlapped with the data line. The second light-shielding layer is disposed on the first light-shielding layer. The first light-shielding layer is extended in a second direction, there is a first included angle between the first direction and the second direction, and the first included angle satisfies a following relationship: $0° \leq \theta1 \leq 20°$, wherein θ1 is the first included angle.

20 Claims, 11 Drawing Sheets

10b

20

ELECTRONIC DEVICE

CROSS-REFERENCE TO RELATED APPLICATION

This application claims the priority benefits of U.S. provisional application Ser. No. 63/449,317, filed on Mar. 2, 2023, and China application serial no. 202311233698.7, filed on Sep. 22, 2023. The entirety of each of the above-mentioned patent applications is hereby incorporated by reference herein and made a part of this specification.

BACKGROUND OF THE DISCLOSURE

Technical Field

The disclosure relates to an electronic device, and more particularly, to a display panel.

Description of Related Art

In existing display panels, a plurality of oblique slits are formed in the common electrode and/or the pixel electrode to control a plurality of liquid-crystal molecules in the liquid-crystal layer to tilt in a plurality of directions, thereby achieving a wide viewing angle. However, when the process for forming an electrode and/or a light-shielding layer having slits produces a relatively large offset or the resulting electrode and/or light-shielding layer has unexpected dimensions, unexpected disclination lines are readily produced, causing the LCD panel to have dark lines on a microscopic scale and a relatively low transmittance on a macroscopic scale. Accordingly, in order to maintain the display brightness of the display panel, the power consumption of the backlight module used for the display panel may be increased as a result.

SUMMARY

Some embodiments of the disclosure are directed to an electronic device having relatively good display quality and/or that may have relatively low power consumption.

An electronic device provided according to some embodiments of the disclosure includes a substrate, a data line, a transparent conductive layer, a first light-shielding layer, and a second light-shielding layer. The data line is disposed on the substrate. The transparent conductive layer is disposed on the data line and has a slit, wherein the slit has a trunk portion, and the trunk portion is extended in a first direction. The first light-shielding layer is disposed on the data line and overlapped with the data line. The second light-shielding layer is disposed on the first light-shielding layer. The first light-shielding layer is extended in a second direction, there is a first included angle between the first direction and the second direction, and the first included angle satisfies a following relationship: $0° \leq \theta 1 \leq 20°$, wherein $\theta 1$ is the first included angle.

In order to make the aforementioned features and advantages of the disclosure more comprehensible, embodiments accompanied with figures are described in detail below.

DESCRIPTION OF THE EMBODIMENTS

Figure 1:
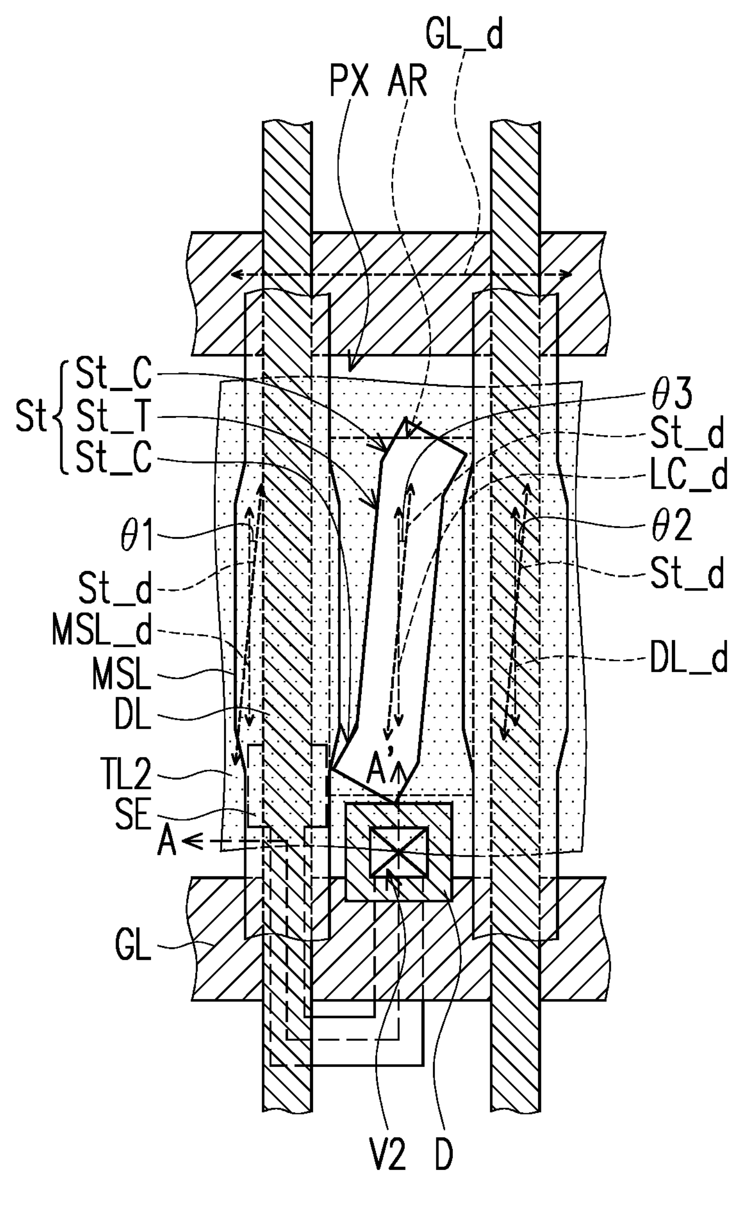
FIG. 1 is a partial top schematic diagram of an electronic device of the first embodiment of the disclosure.

Reference will now be made in detail to the exemplary embodiments of the disclosure, and examples of the exemplary embodiments are illustrated in the accompanying drawings. Wherever possible, the same reference numerals are used in the figures and the descriptions to refer to the same or similar portions.

The disclosure may be understood by referring to the following detailed description in combination with the accompanying drawings. It should be noted that, in order to make it easy for readers to understand and the drawings to be concise, many of the drawings in the disclosure depict a portion of the electronic device, and certain elements in the drawings are not drawn to actual scale. In addition, the number and size of elements in the figures are for illustration and are not intended to limit the scope of the disclosure.

Certain terms are used throughout the specification and attached claims of the disclosure to refer to particular elements. Those skilled in the art should understand that manufacturers of electronic devices may refer to the same element with different names. The specification does not intend to distinguish between elements having the same function but different names. In the following specification and claims, words such as "including", "containing", "having" are open-ended words, so they should be interpreted as meaning "containing but not limited to . . . " Therefore, when the terms "including", "containing", and/or "having" are used in the description of the disclosure, they specify the presence of the corresponding features, regions, steps, operations, and/or members. However, the existence of one or a plurality of corresponding features, regions, steps, operations, and/or members is not excluded.

The directional terms mentioned herein, such as "upper", "lower", "front", "rear", "left", "right", etc., refer to the directions of the drawings. Accordingly, the directional terms used are for illustration, not for limiting the disclosure. In the drawings, each figure illustrates the general characteristics of methods, structures, and/or materials used in particular embodiments. However, these drawings should not be interpreted as defining or limiting the scope or nature encompassed by these embodiments. For example, the relative dimensions, thicknesses, and positions of layers, regions, and/or structures may be reduced or exaggerated for clarity.

When a corresponding member (such as a layer or region) is referred to as being "on another member", it may be directly on the other member, or other members may be present between the two members. Moreover, when a member is referred to as being "directly on another member", there are no intervening members unless otherwise stated in the specification. Moreover, when a member is said to be "on another member", the two have a top-down relationship in the top direction. This member may be above or below the other member, and this relationship depends on the orientation of the device.

The terms "equal to" or "the same", "substantially" or "approximately" are generally interpreted to mean within 20% of a given value or range, or to mean within 10%, 5%, 3%, 2%, 1%, or 0.5% of a given value or range.

Words such as "first" and "second" used in the specification and claims are used to modify elements, which do not themselves imply and represent that the (or these) elements have any previous ordinal numbers, nor do they imply an order of a certain element with another element, or an order in manufacturing methods. These ordinal numbers are used to clearly distinguish an element having a certain designation from another element having the same designation. The same wording may be not used in the claims and the specification. Accordingly, the first member in the specification may be the second member in the claims.

It should be noted that, in the following embodiments, without departing from the spirit of the disclosure, features in several different embodiments may be replaced, reorganized, and mixed to complete other embodiments. As long as the features of the various embodiments do not violate the spirit of the disclosure or conflict each other, they may be mixed and matched arbitrarily.

The electrical connection described in the disclosure may both refer to direct connection or indirect connection. In the case of a direct connection, the terminals of elements on two circuits are connected directly or to each other via a conductor segment. In the case of indirect connection, there are switches, diodes, capacitors, inductors, resistors, other suitable elements, or a combination of the above elements between the terminals of the elements on the two circuits, but the disclosure is not limited thereto.

In the disclosure, thickness, length, width, and area may be measured by using an optical microscope, and thickness may be measured by a cross-sectional image in an electron microscope, but the disclosure is not limited thereto. In addition, any two values or directions used for comparison may have a certain error. If the first value is equal to the second value, it implies that there may be an error of about 10% between the first value and the second value; if the first direction is perpendicular to the second direction, the angle between the first direction and the second direction may be between 80 degrees and 100 degrees. If the first direction is parallel to the second direction, the angle between the first direction and the second direction may be between 0° and 10°.

The electronic device of the disclosure may include a packaging device, a display device, a sensing device, a backlight device, an antenna device, a tiling device, a power management device, a wearable device (including, for example, augmented reality or virtual reality), other suitable electronic devices, or any suitable device applied to the above devices, but the disclosure is not limited thereto. The electronic device may be a bendable, flexible, or stretchable electronic device. The display device may include a non-self-luminous display device or a self-luminous display device. The non-self-luminous display device includes, for example, a liquid-crystal display device, but the disclosure is not limited thereto. The self-luminous display device includes, for example, a light-emitting diode display device, but the disclosure is not limited thereto. The display device may be applied to, for example, notebook computers, public displays, tiling displays, automotive displays, touch displays, televisions, monitors, smart phones, tablet computers, light source modules, lighting equipment, or electronic devices such as those used in the above products, but the disclosure is not limited thereto. The sensing device may include a biometric sensor, a touch sensor, a fingerprint sensor, other suitable sensors, or a combination of the above types of sensors. The antenna device may be a liquid-crystal antenna device or a non-liquid-crystal antenna device, such as a liquid-crystal antenna device, but the disclosure is not limited thereto. The tiling device may include, for example, a display tiling device or an antenna tiling device, but the disclosure is not limited thereto. The shape of the electronic device may be rectangular, circular, polygonal, a shape having curved edges, or other suitable shapes. The electronic device may include an electronic unit, wherein the electronic unit may include a passive element and an active element, such as a capacitor, a resistor, an inductor, a diode, a transistor, a sensor, and the like. The diode may include a light-emitting diode or a photodiode. The light-emitting diode may include, for example, an organic light-emitting diode (OLED) or an inorganic light-emitting diode, and the inorganic light-emitting diode may include, for example, a mini LED, a micro LED, or a quantum dot LED, but the disclosure is not limited thereto. It should be noted that the electronic device of the disclosure may be various combinations of the above devices, but the disclosure is not limited thereto. The electronic device may have a peripheral system such as a drive system, a control system, and a light source system to support a display device, an antenna device, a wearable device (for example, including augmented reality or virtual reality), a vehicle-mounted device (for example, including a car windshield), or a tiling device.

Figure 2:
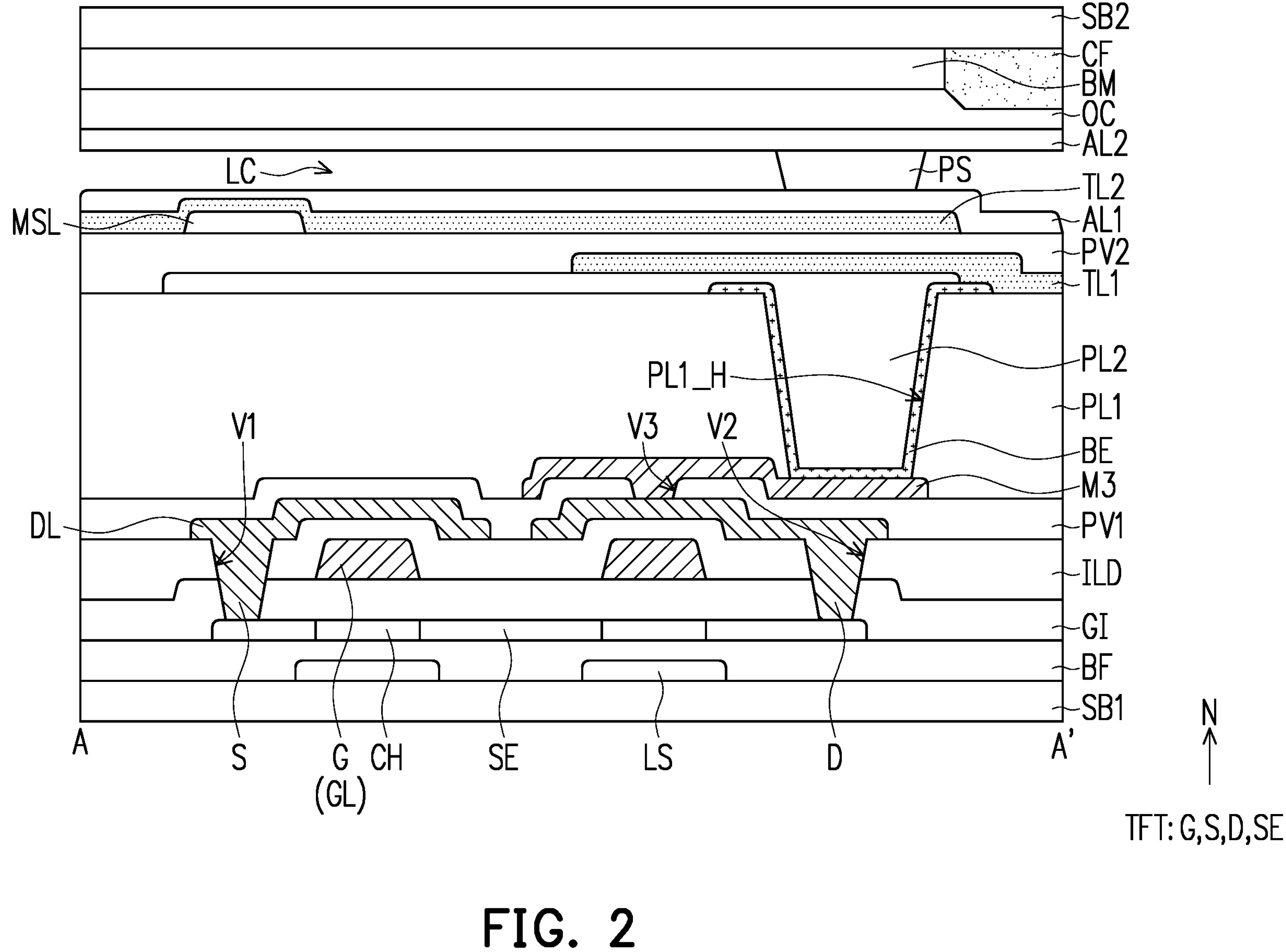
FIG. 2 is a partial cross-sectional schematic diagram of an embodiment according to the cross-section line A-A' of FIG. 1.

FIG. 1 is a partial top schematic diagram of an electronic device of the first embodiment of the disclosure, and FIG. 2 is a partial cross-sectional schematic diagram of an embodiment according to the cross-section line A-A' of FIG. 1.

Please refer to FIG. 1 and FIG. 2 simultaneously. An electronic device 10*a* of the present embodiment includes a substrate SB1, a data line DL, a transparent conductive layer TL1, a first light-shielding layer MSL, and a second light-shielding layer BM. In some embodiments, the electronic device 10*a* of the present embodiment further includes a buffer layer BF, a semiconductor layer SE, a gate insulating layer GI, a gate line GL, an interlayer insulating layer ILD, a light-shielding layer LS, an insulating layer PV1, a conductive layer M3, a planar layer PL1, a bridge electrode BE, a planar layer PL2, an insulating layer PV2, a transparent conductive layer TL2, a substrate SB2, a dielectric layer LC, and a support member PS.

The substrate SB1 may be, for example, a flexible substrate or a non-flexible substrate. In some embodiments, the material of the substrate SB1 may include glass, plastic, or a combination thereof. For example, the material of the substrate SB may include quartz, sapphire, polymethyl methacrylate (PMMA), polycarbonate (PC), polyimide (PI), polyethylene terephthalate (PET), or other suitable materials, or a combination of the above materials, but the disclosure is not limited thereto.

The buffer layer BF is disposed on the substrate SB1, for example. The buffer layer BF may, for example, have relatively good bonding properties with a subsequent layer formed thereon, but the disclosure is not limited thereto. The material of the buffer layer BF may be, for example, an inorganic material (for example, silicon oxide, silicon nitride, silicon oxynitride, or a stacked layer of at least two of the above materials). In some embodiments, the buffer layer BF may have a single-layer structure or a multi-layer structure, but the disclosure is not limited thereto.

An active element TFT is disposed on the substrate SB1, for example. In the present embodiment, the active element TFT may be disposed on the buffer layer BF. In some embodiments, the active element TFT may include a gate G, a source S, a drain D, and a semiconductor layer SE, but the disclosure is not limited thereto. The gate G may be, for example, at least partially overlapped with the semiconductor layer SE in a normal direction N of the substrate SB, wherein the region where the semiconductor layer SE and the gate G are overlapped may be regarded as a channel region CH. In some embodiments, a gate insulating layer GI is disposed between the gate G and the semiconductor layer SE. The source S and the drain D are, for example, separated from each other, and each is electrically connected to the semiconductor layer SE. The gate G of the active element TFT may be a portion of the gate line GL, that is, the gate G is electrically connected to the gate line GL; the source S of the active element TFT may be a portion of the data line DL, that is, the source S is electrically connected to the data line DL. In some embodiments, the material of the semiconductor layer SE may include amorphous silicon, low-temperature polycrystalline silicon (LTPS), metal oxide, other suitable materials, or a combination thereof, wherein the metal oxide may include indium gallium zinc oxide (IGZO), but the disclosure is not limited thereto. In some embodiments, an interlayer insulating layer ILD and a gate insulating layer GI are disposed between the source S (or the drain D) and the semiconductor layer SE, wherein the source S and the drain D are each electrically connected to the source region and the drain region of the semiconductor layer SE via a through hole V1 and a through hole V2 penetrating the interlayer insulating layer ILD and the gate insulating layer GI, but the disclosure is not limited thereto. The material of the gate insulating layer GI and the interlayer insulating layer ILD may be, for example, an inorganic material (such as silicon oxide, silicon nitride, silicon oxynitride, or stacked layers of at least two of the above materials), but the disclosure is not limited thereto. In some embodiments, the gate insulating layer GI and/or the interlayer insulating layer ILD may be a single-layer structure or a multi-layer structure. It is worth noting that although the active element TFT of the present embodiment is a top gate-type TFT, the disclosure is not limited thereto.

The gate line GL and the data line DL are, for example, disposed on the substrate SB1. In some embodiments, the gate line GL is disposed on the gate insulating layer GI and has an extending direction GL_d, and the data line DL is disposed on the interlayer insulating layer ILD and has an extending direction DL_d, wherein the extending direction GL_d of the gate line GL is different from the extending direction DL_d of the data line DL. In the present embodiment, the extending direction GL_d of the gate line GL is perpendicular to the extending direction DL_d of the data line DL, but the disclosure is not limited thereto. Moreover, in the present embodiment, the extending direction GL_d of the gate line GL is parallel to a first direction X (the extending direction of the X-axis), and the extending direction DL_d of the data line DL is parallel to a second direction Y (the extending direction of the Y-axis), but the disclosure is not limited thereto. In some embodiments, the first direction X and the second direction Y may be perpendicular to the normal direction N of the substrate SB1. The gate G in the active element TFT can, for example, be electrically connected to the corresponding gate line GL to receive the corresponding gate signal, and the source S in the active element TFT may, for example, be electrically connected to the corresponding data line DL to receive the corresponding data signal. In some embodiments, the material of the gate line GL and the data line DL may each include, for example, molybdenum (Mo), titanium (Ti), tantalum (Ta), niobium (Nb), hafnium (Hf), nickel (Ni), chromium (Cr), cobalt (Co), zirconium (Zr), tungsten (W), aluminum (Al), copper (Cu), silver (Ag), other suitable metals, or an alloy or a combination of the above materials, but the disclosure is not limited thereto. The gate line GL and the data line DL may, for example, include the same or different materials, but the disclosure is not limited thereto.

In the present embodiment, two adjacent gate lines GL and two adjacent data lines DL may define one sub-pixel structure PX of the electronic device 10*a*, but the disclosure is not limited thereto. For example, there is an opening region AR in each of the sub-pixel structures PX, wherein the opening region AR represents a region in the sub-pixel structure PX that is not provided with members such as the active element TFT and other wirings that block the passage of light. For example, the opening region AR may be a region surrounded by at least one of the light-shielding layer LS, the metal wiring (for example, the gate line GL or the data line DL), the conductive layer M3, the first light-shielding layer MSL, and the second light-shielding layer BM.

The light-shielding layer LS is disposed on the substrate SB1, for example. In the present embodiment, the light-shielding layer LS is disposed between the substrate SB1 and the semiconductor layer SE of the active element TFT. In detail, the light-shielding layer LS may be disposed between the substrate SB and the channel region CH of the semiconductor layer SE, for example, in the normal direction N of the substrate 100, but the disclosure is not limited thereto. The light-shielding layer LS is, for example, at least partially overlapped with the channel region CH of the semiconductor layer SE in the normal direction N of the substrate SB1, thereby alleviating the influence and deterioration of the channel region CH due to exposure to external ambient light. In some embodiments, the light-shielding layer LS may include a material having both relatively low reflectivity and low transmittance. In other implementations, the light-shielding layer LS is extended, for example, along the first direction X and corresponds to the gate line GL, but the disclosure is not limited thereto. For example, the light-shielding layer LS may include photoresist, ink, resin, colorant, metal and an oxide thereof or other organic materials, or other suitable materials, or a combination thereof. In some embodiments, the reflectivity of the light-shielding layer LS may be greater than or equal to 0% and less than 70%, but the disclosure is not limited thereto. In some embodiments, the light-shielding layer LS may serve as a lower gate and form a dual gate (dual gate or double gate) TFT structure with the TFT of the upper gate structure.

The insulating layer PV1 is, for example, disposed on the gate line GL and the data line DL. In the present embodiment, the insulating layer PV1 covers the source S of the active element TFT and partially covers the drain D. That is, the insulating layer PV1 has a through hole V3 exposing a portion of the drain D, but the disclosure is not limited thereto. The material of the insulating layer PV1 may include, for example, an inorganic material (such as silicon oxide, silicon nitride, silicon oxynitride, or stacked layers of at least two of the above materials), an organic material (such as polyimide resin, epoxy resin, or acrylic resin) or a combination of the above, but the disclosure is not limited thereto.

The conductive layer M3 is, for example, disposed on the insulating layer PV1. In the present embodiment, the conductive layer M3 is electrically connected to the drain D of the active element TFT via the through hole V3 of the insulating layer PV1. In some embodiments, the conductive layer M3 may be used to electrically connect the active element TFT and the transparent conductive layer TL1 introduced later, but the disclosure is not limited thereto. The material of the conductive layer M3 may include metal, metal oxide, other suitable materials, or a combination thereof, but the disclosure is not limited thereto. In some embodiments, the conductive layer M3 may be omitted, and the transparent conductive layer TL1 may be directly electrically connected to the drain D.

The planar layer PL1 is, for example, disposed on the insulating layer PV1 and partially covers the conductive layer M3. Viewed from another perspective, the planar layer PL1 may, for example, include a hole PL1_H exposing a portion of the conductive layer M3. The material of the planar layer PL1 may be, for example, an organic material (such as polytetrafluoroethylene, polyimide, parylene, benzocyclobutene, or other suitable materials), but the disclosure is not limited thereto. In the present embodiment, the planar layer PL1 may have a relatively flat top surface, so that a subsequent film layer formed thereon has a relatively good yield.

The bridge electrode BE is, for example, disposed on the planar layer PL1. In the present embodiment, the bridge electrode BE is disposed in the hole PL1_H of the planar layer PL1 and electrically connected to the conductive layer M3. In some embodiments, the bridge electrode BE and the conductive layer M3 may be used together to electrically connect the active element TFT and the transparent conductive layer TL1 introduced later, but the disclosure is not limited thereto. The material of the bridge electrode BE may, for example, include a metal oxide conductive material (for example: indium tin oxide, indium zinc oxide, aluminum tin oxide, aluminum zinc oxide, indium germanium zinc oxide), but the disclosure is not limited thereto.

The planar layer PL2 is, for example, disposed on the planar layer PL1. In the present embodiment, the planar layer PL2 is filled in the hole PL1_H of the planar layer PL1 and covers the bridge electrode BE disposed in the hole PL1_H of the planar layer PL1, but the disclosure is not limited thereto. Moreover, in the present embodiment, the planar layer PL2 exposes a portion of the bridge electrode BE not disposed in the hole PL1_H of the planar layer PL1, so that the bridge electrode BE may be electrically connected to the transparent conductive layer TL1 introduced later. The material of the planar layer PL2 may be, for example, an organic material (such as polytetrafluoroethylene, polyimide, parylene, benzocyclobutene, or other suitable materials), but the disclosure is not limited thereto. In the present embodiment, the planar layer PL2 may have a relatively flat top surface, so that a subsequent film layer formed thereon has a relatively good yield. In some embodiments, the planar layer PL2 may be overlapped with the gate line GL in the normal direction N of the substrate SB.

The transparent conductive layer TL1 is, for example, disposed on the planar layer PL2. In the present embodiment, the transparent conductive layer TL1 is electrically connected to the bridge electrode BE exposed by the planar layer PL2, and may be used as a pixel electrode, but the disclosure is not limited thereto. The material of the transparent conductive layer TL1 may, for example, include a metal oxide conductive material (for example: indium tin oxide, indium zinc oxide, aluminum tin oxide, aluminum zinc oxide, indium germanium zinc oxide), but the disclosure is not limited thereto.

The insulating layer PV2 is, for example, disposed on the transparent conductive layer TL1 and covers the transparent conductive layer TL1. The material of the insulating layer PV2 may include, for example, an inorganic material (such as silicon oxide, silicon nitride, silicon oxynitride, or stacked layers of at least two of the above materials), an organic material (such as polyimide resin, epoxy resin, or acrylic resin) or a combination of the above, but the disclosure is not limited thereto.

The first light-shielding layer MSL is, for example, disposed on the insulating layer PV2. In the present embodiment, the first light-shielding layer MSL is disposed on the data line DL and overlapped with the data line DL, but the disclosure is not limited thereto. In detail, the first light-shielding layer MSL is overlapped with the data line DL in the normal direction N of the substrate SB, for example. In some embodiments, the material of the first light-shielding layer MSL may include a metal material or any suitable light-shielding material, for example, an opaque inorganic or organic material, a black resin, a low-reflective metal material, metal-nitrogen oxide, and a combination of the above, but the disclosure is not limited thereto. The low-reflective metal material may include, for example, aluminum, molybdenum, titanium, oxide of the above, nitride of the above, molybdenum oxide doped tantalum (ex: $MoO_xTa$), other suitable materials, or a combination of at least two of the above. Accordingly, the first light-shielding layer MSL can, for example, reduce the phenomenon of color mixing of light of different colors emitted by adjacent sub-pixel structures PX, so as to improve the display effect of the electronic device **10*a*** at a wide viewing angle.

In some embodiments, the first light-shielding layer MSL may, for example, include a plurality of portions between two adjacent gate lines GL. As shown in FIG. 1, in the present embodiment, the first light-shielding layer MSL has an extending direction MSL_d, wherein the extending direction MSL_d of the first light-shielding layer MSL is parallel to the second direction Y (the extending direction of the Y-axis), but the disclosure is not limited thereto. In other embodiments, the first light-shielding layer MSL may have a mesh shape, that is, the first light-shielding layer MSL may include a first portion extended in the first direction X and a second portion extended in the second direction Y.

The transparent conductive layer TL2 is, for example, disposed on the insulating layer PV2, and may at least partially cover the first light-shielding layer MSL. In the present embodiment, the transparent conductive layer TL2 is electrically connected to the first light-shielding layer MSL and may be used as a common electrode, but the disclosure is not limited thereto. The material of the transparent conductive layer TL2 may, for example, include a metal oxide conductive material (for example: indium tin oxide, indium zinc oxide, aluminum tin oxide, aluminum zinc oxide, indium germanium zinc oxide), but the disclosure is not limited thereto. It is worth noting that in other embodiments, the first light-shielding layer MSL may be disposed above the transparent conductive layer TL2, that is, the first light-shielding layer MSL may at least partially cover the transparent conductive layer TL2.

In some embodiments, the transparent conductive layer TL2 is disposed on the data line DL and has a slit St. In the present embodiment, the slit St has a trunk portion St_T and corner portions St_C located at two opposite ends of the trunk portion St_T, wherein the trunk portion St_T has an extending direction St_d (that is, the trunk portion St_T is extended in this direction), and there may be a non-zero included angle between the extending direction of the corner portions St_C and the extending direction St_d of the trunk portion St_T.

In the present embodiment, there is an included angle θ1 between the extending direction St_d of the trunk portion St_T of the slit St and the extending direction MSL_d of the first light-shielding layer MSL, and the included angle θ1 satisfies the following relationship: $0° \leq \theta 1 \leq 20°$. In some other embodiments, the included angle θ1 may satisfy the following relationship: $0° \leq \theta 1 \leq 15°$.

By making the angle θ1 between the extending direction St_d of the trunk portion St_T of the slit St and the extending direction MSL_d of the first light-shielding layer MSL satisfy the above relationship, when the resulting first light-shielding layer MSL and/or transparent conductive layer TL2 is offset or the resulting first light-shielding layer MSL and/or transparent conductive layer TL2 has unexpected dimensions, the possibility of the electronic device 10*a* producing significant dark lines may be reduced to increase the transmittance of the electronic device 10*a*.

Moreover, in the present embodiment, there is an included angle θ2 between the extending direction St_d of the trunk portion St_T of the slit St and the extending direction DL_d of the data line DL, and the included angle θ2 satisfies the following relationship: $0° \leq \theta 2 \leq 20°$. In some other embodiments, the included angle θ2 may satisfy the following relationship: $0° \leq \theta 2 \leq 15°$.

By making the angle θ2 between the extending direction St_d of the trunk portion St_T of the slit St and the extending direction DL_d of the data line DL satisfy the above relationship, when the resulting first light-shielding layer MSL (overlapped with the data line DL) and/or transparent conductive layer TL2 is offset or the resulting first light-shielding layer MSL and/or transparent conductive layer TL2 has unexpected dimensions, the possibility of the electronic device 10*a* producing significant dark lines may be reduced to increase the transmittance of the electronic device 10*a*.

The substrate SB2 is, for example, disposed opposite to the substrate SB1, wherein the material of the substrate SB2 may be the same as or similar to the material of the substrate SB1 and is not described again.

The second light-shielding layer BM and the color filter CF are disposed on the substrate SB2, for example. In the present embodiment, the second light-shielding layer BM and the color filter CF are each disposed on the surface of the substrate SB2 facing the substrate SB1, for example, but the disclosure is not limited thereto. In some embodiments, the material of the second light-shielding layer BM may include black resin, but the disclosure is not limited thereto. In some other embodiments, the material of the second light-shielding layer BM may include a metal material having lower reflectivity. Accordingly, the second light-shielding layer BM may be used, for example, to shield elements and wiring inside the electronic device 10*a* not intended to be seen by the user, so as to improve the display effect of the electronic device 10*a*. The color filter CF may include, for example, a red filter pattern, a green filter pattern, or a blue filter pattern, thereby allowing the electronic device 10*a* to have a colored display screen, but the disclosure is not limited thereto.

The dielectric layer LC is, for example, disposed between the substrate SB1 and the substrate SB2. In detail, the dielectric layer LC is, for example, disposed between the first light-shielding layer MSL and the second light-shielding layer BM. In the present embodiment, the material of the dielectric layer LC includes liquid-crystal molecules. In some embodiments, the dielectric layer LC may include electrically controlled birefringence (ECB) liquid-crystal molecules, vertical alignment (VA) liquid-crystal molecules, or other suitable liquid-crystal molecules, but the disclosure is not limited thereto. The dielectric layer LC may be formed between the substrate SB1 and the substrate SB2 by, for example, a liquid-crystal drop process (one drop fill; ODF), but the disclosure is not limited thereto.

The support member PS is, for example, disposed between the substrate SB1 and the substrate SB2, and is used, for example, to support the substrate SB1 and the substrate SB2. In some embodiments, the support member PS may be used to define a cell gap of the electronic device 10*a*. The material included in the support PS is not particularly limited, and may include, for example, an organic photosensitive material. In addition, the shape of the support member PS is not particularly limited, and may be, for example, columnar.

In the present embodiment, the electronic device 10*a* also includes an alignment layer AL1 and an alignment layer AL2, wherein the alignment layer AL1 is disposed below the dielectric layer LC, and the alignment layer AL2 is disposed above the dielectric layer LC. From another perspective, the dielectric layer LC is, for example, disposed between the alignment layer AL1 and the alignment layer AL2 in the normal direction N of the substrate SB1. The alignment layer AL1 and the alignment layer AL2 may, for example, be used to make the dielectric layer LC have an alignment direction LC_d (that is, the dielectric in the dielectric layer LC has a pretilt angle). In detail, via the arrangement of the alignment layer AL1 and the alignment layer AL2, the liquid-crystal molecules in the dielectric layer LC may be aligned, for example, via changes in voltage. For example, when the electronic device 10*a* is not driven, the liquid-crystal molecules in the dielectric layer LC are aligned according to the alignment directions of the alignment layer AL1 and the alignment layer AL2. In contrast, when the electronic device 10*a* is driven, the liquid-crystal molecules in the dielectric layer LC may have a corresponding tilt direction according to the voltage between the transparent conductive layer TL1 and the transparent conductive layer TL2. In some embodiments, the material of the alignment layer AL1 and the alignment layer AL2 may include polyimide, but the disclosure is not limited thereto. In some embodiments, the alignment direction LC_d of the dielectric layer LC may be measured using an appropriate electronic instrument such as a polarization meter and/or a phase difference measurement system, but the disclosure is not limited thereto.

In the present embodiment, there is an included angle θ3 between the alignment direction LC_d of the dielectric layer LC and the extending direction St_d of the trunk portion St_T of the slit St, and the included angle θ3 satisfies the following relationship: $0° \leq \theta 3 \leq 20°$. In some other embodiments, the included angle θ3 may satisfy the following relationship: $0° \leq \theta 3 \leq 15°$. It is worth noting that the included angle θ3 is based on the fact that the dielectric in the dielectric layer LC includes positive liquid crystal. In contrast, when the dielectric in the dielectric layer LC includes negative liquid crystal, the included angle θ3 may satisfy the following relationship: 70°≤θ3≤90°. In some other embodiments, the included angle θ3 may satisfy the following relationship: 75°≤θ3≤90°.

Figure 3:
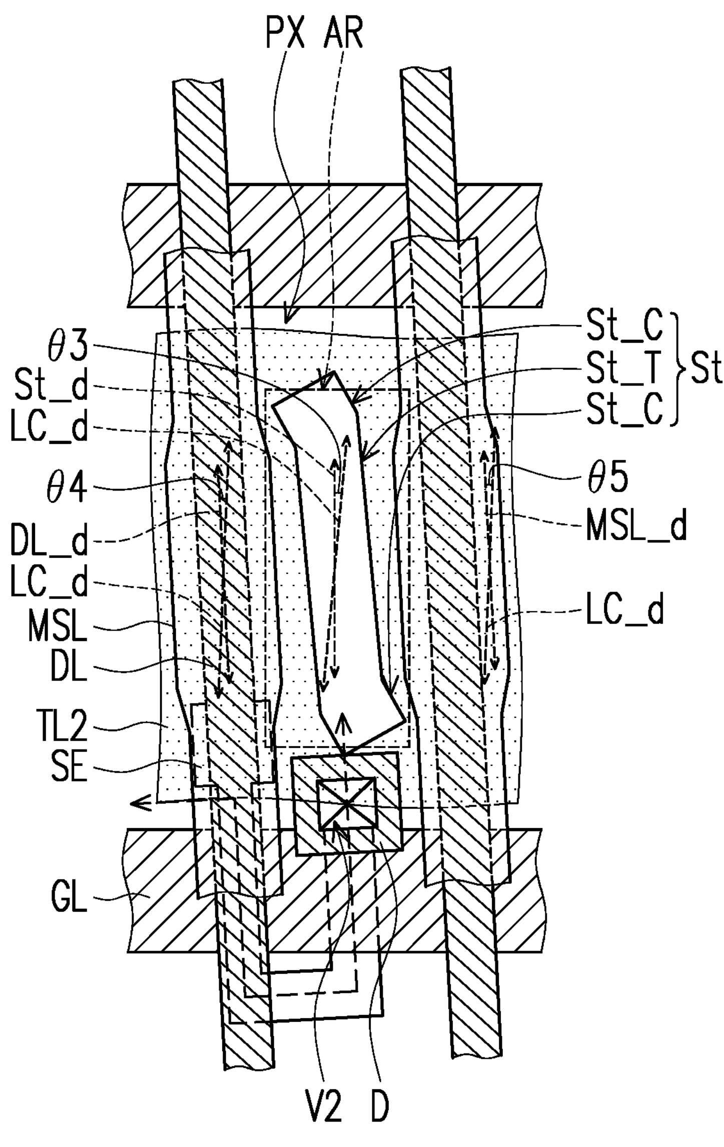
FIG. 3 is a partial top schematic diagram of an electronic device of the second embodiment of the disclosure.
Figure 3:
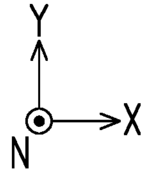

Moreover, in other embodiments, there may be an included angle between the alignment direction LC_d of the dielectric layer LC and the extending direction DL_d of the data line DL, and there may be an included angle between the alignment direction LC_d of the dielectric layer LC and the extending direction MSL_d of the first light-shielding layer MSL, which is shown in the embodiment of FIG. 3 below.

In some embodiments, the electronic device 10*a* may further include an insulation layer OC. The insulating layer OC is, for example, disposed between the alignment layer AL2 and the second light-shielding layer BM in the normal direction N of the substrate SB1, so that the alignment layer AL2 may be stably disposed on the substrate SB2. The material of the insulating layer OC may include, but is not limited to, a transparent organic material, such as a photoresist material.

In some embodiments, the electronic device 10*a* may also include a backlight module (not shown). The backlight module may, for example, be disposed on a surface of the substrate SB1 away from the substrate SB2, but the disclosure is not limited thereto.

FIG. 3 is a partial top schematic diagram of an electronic device of the second embodiment of the disclosure. It should be mentioned that, the embodiment of FIG. 3 may adopt the reference numerals of the embodiments of FIG. 1 and FIG. 2 and a portion of the contents thereof, wherein the same or similar reference numerals are used to represent the same or similar elements and descriptions of the same technical contents are omitted.

Referring to FIG. 3, the main difference between an electronic device 10*b* and the electronic device 10*a* is that the extending direction DL_d of the data line DL is not parallel to the second direction Y (the extending direction of the Y-axis).

In the present embodiment, there may be an included angle less than or equal to 20° between the extending direction DL_d of the data line DL and the second direction Y (0°<the included angle between the extending direction DL_d of the data line DL and the second direction) Y≤20°. Therefore, there may also be an included angle less than or equal to 20° between the extending direction MSL_d of the first light-shielding layer MSL overlapped with the data line DL and the second direction Y, for example (0°<the included angle between the extending direction MSL_d of the first light-shielding layer MSL and the second direction) Y≤20°.

In the present embodiment, there is an included angle θ4 between the alignment direction LC_d of the dielectric layer LC and the extending direction DL_d of the data line DL, and the included angle θ4 satisfies the following relationship: 0°≤θ4≤20°. In some other embodiments, the included angle θ4 may satisfy the following relationship: 0°≤θ4≤15°. It is worth noting that the included angle θ4 is based on the fact that the dielectric in the dielectric layer LC includes positive liquid crystal. In contrast, when the dielectric in the dielectric layer LC includes negative liquid crystal, the included angle θ4 may satisfy the following relationship: 70°≤θ4≤90°. In some other embodiments, the included angle θ4 may satisfy the following relationship: 75°≤θ4≤90°.

Moreover, in the present embodiment, there is an included angle θ5 between the alignment direction LC_d of the dielectric layer LC and the extending direction MSL_d of the first light-shielding layer MSL, and the included angle θ5 satisfies the following relationship: 0°≤θ5≤20°. In some other embodiments, the included angle θ5 may satisfy the following relationship: 0°≤θ5≤15°. It is worth noting that the included angle θ5 is based on the fact that the dielectric in the dielectric layer LC includes positive liquid crystal. In contrast, when the dielectric in the dielectric layer LC includes negative liquid crystal, the included angle θ5 may satisfy the following relationship: 70°≤θ5≤90°. In some other embodiments, the included angle θ5 may satisfy the following relationship: 75°≤θ5≤90°.

Figure 4:
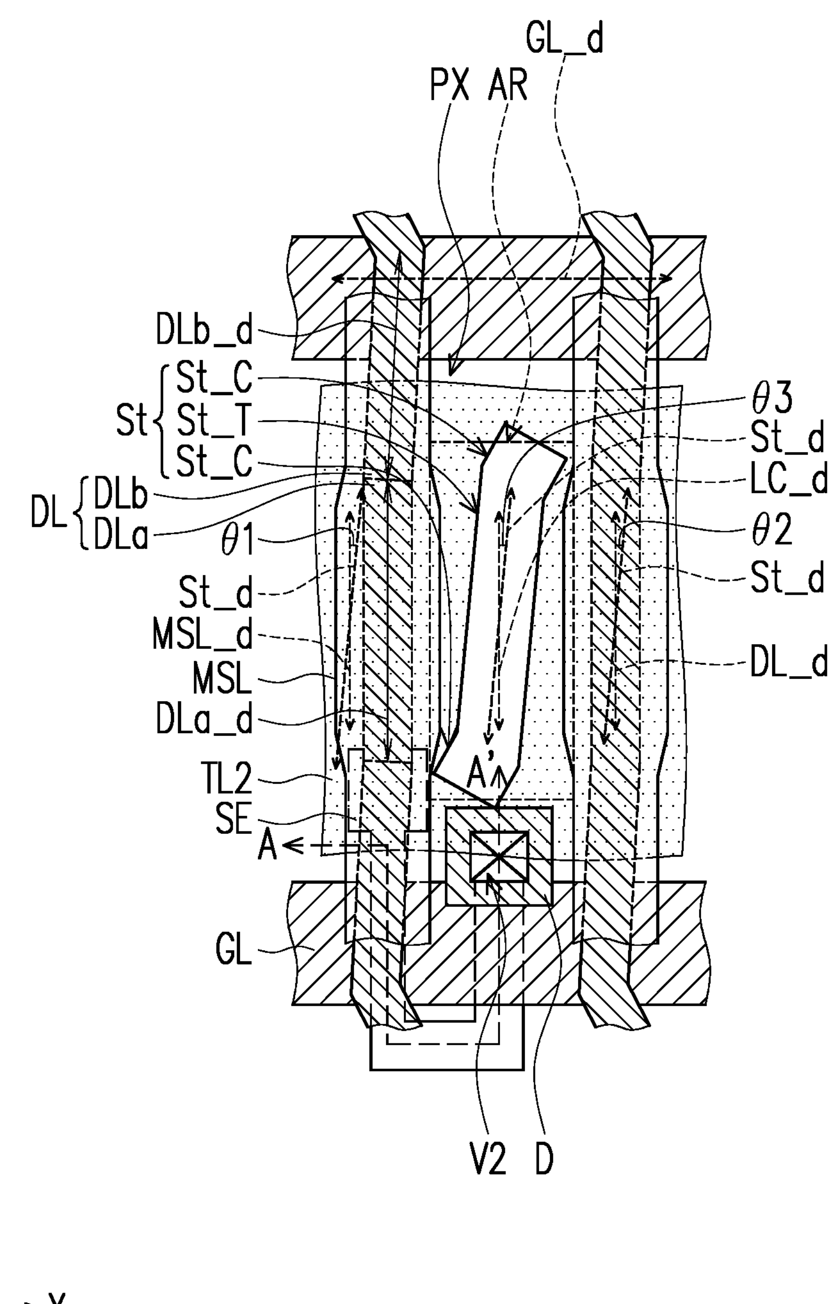
FIG. 4 is a partial top schematic diagram of an electronic device of the third embodiment of the disclosure.
Figure 5:
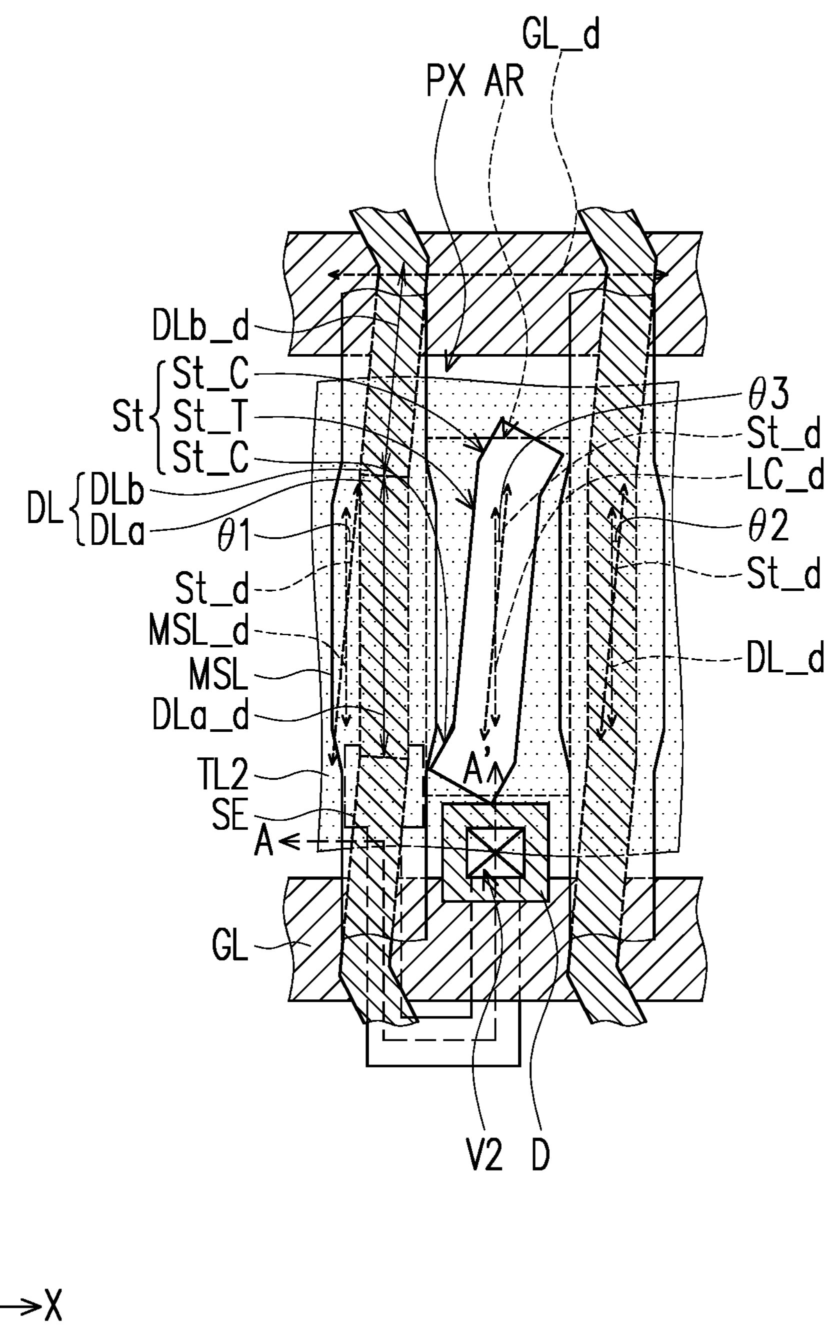
FIG. 5 is a partial top schematic diagram of an electronic device of the fourth embodiment of the disclosure.

FIG. 4 is a partial top schematic diagram of an electronic device of the third embodiment of the disclosure, and FIG. 5 is a partial top schematic diagram of an electronic device of the fourth embodiment of the disclosure. It should be mentioned that, the embodiments of FIG. 4 and FIG. 5 may each adopt the reference numerals of the embodiments of FIG. 1 and FIG. 2 and a portion of the contents thereof, wherein the same or similar reference numerals are used to represent the same or similar elements and descriptions of the same technical contents are omitted.

Please refer to FIG. 4 and FIG. 5. The main differences between an electronic device 10*c* and an electronic device 10*d* and the electronic device 10*a* are: the extending directions of the data line DL, the first light-shielding layer MSL, and the second light-shielding layer BM are not parallel to the second direction Y (the extending direction of the Y-axis), and each has a plurality of portions extended in different directions.

Specifically, the extending direction DL_d of the data line DL is not parallel to the second direction Y (the extending direction of the Y-axis), and the data line DL has a first portion DLa and a second portion DLb extended in different directions.

Specifically, in the present embodiment, the data line DL includes the first portion DLa and the second portion DLb, wherein the first portion DLa has an extending direction DLa_d, and the second portion DLb has an extending direction DLb_d.

In some embodiments, there may be an included angle less than or equal to 20° between the extending direction DLa_d of the first portion DLa and the extending direction DLb_d of the second portion DLb (0°<the included angle between the extending direction DLa_d of the first portion DLa and the extending direction DLb_d of the second portion) DLb≤20°. In the electronic device 10*c* shown in FIG. 4, there is an included angle of 5° between the extending direction DLa_d of the first portion DLa and the extending direction DLb_d of the second portion DLb, and in the electronic device 10*d* shown in FIG. 5, there is an included angle of 10° between the extending direction DLa_d of the first portion DLa and the extending direction DLb_d of the second portion DLb, but the disclosure is not limited thereto.

Accordingly, by making the included angle θ1 between the extending direction St_d of the trunk portion St_T of the slit St and the extending direction MSL_d of the first light-shielding layer MSL satisfy the above relationship; and/or making the included angle θ2 between the extending direction St_d of the trunk portion St_T of the slit St and the extending direction DL_d of the data line DL satisfy the above relationship, when the resulting first light-shielding layer MSL and/or transparent conductive layer TL2 is offset or the resulting first light-shielding layer MSL and/or the transparent conductive layer TL2 has unexpected dimensions, the possibility of the electronic device 10*c* and the electronic device 10d producing significant dark patterns may be reduced, thereby increasing the transmittance of the electronic device 10c and the electronic device 10d.

Figure 6A:
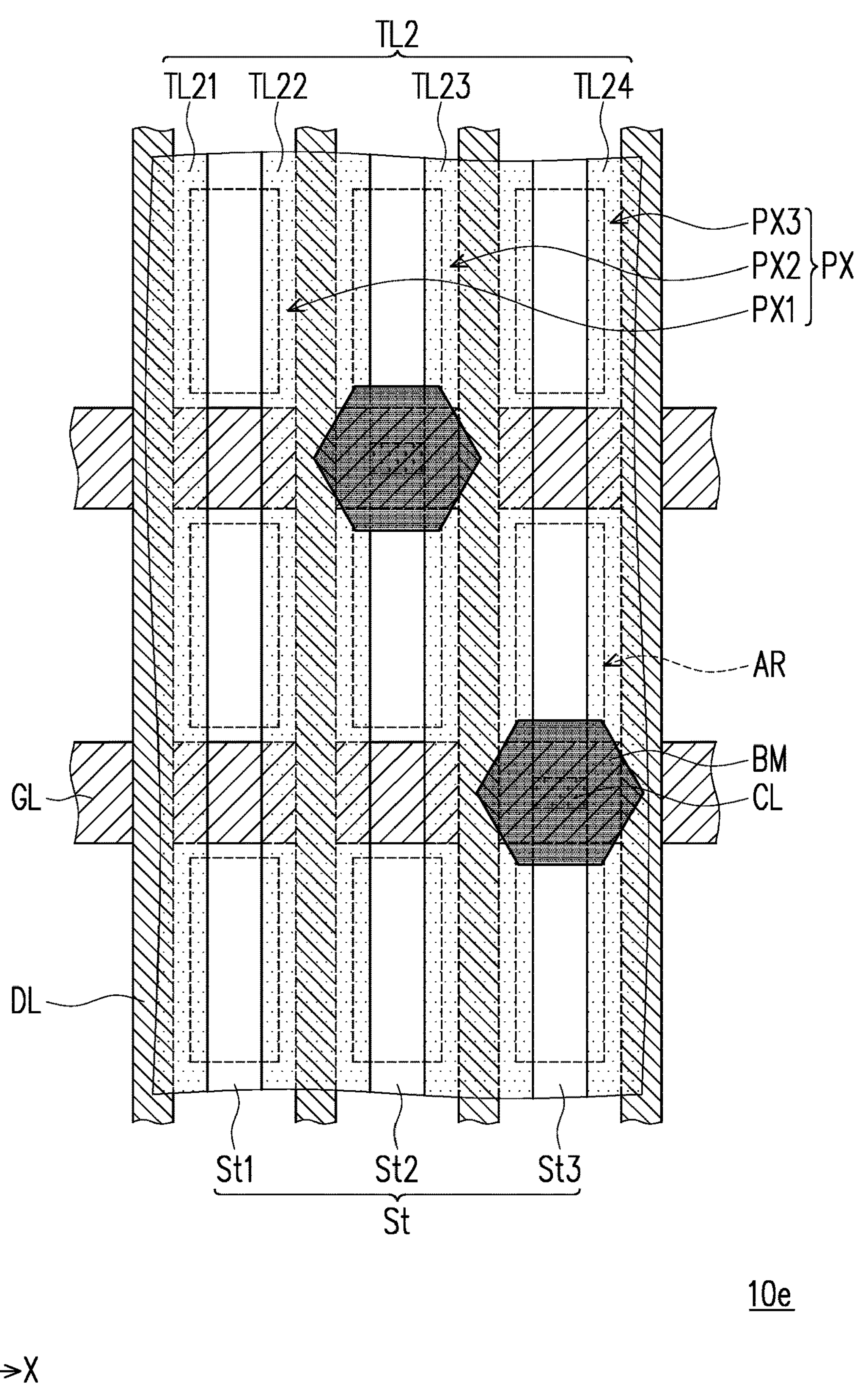
FIG. 6A is a partial top schematic diagram of an electronic device of the fifth embodiment of the disclosure.
Figure 6B:
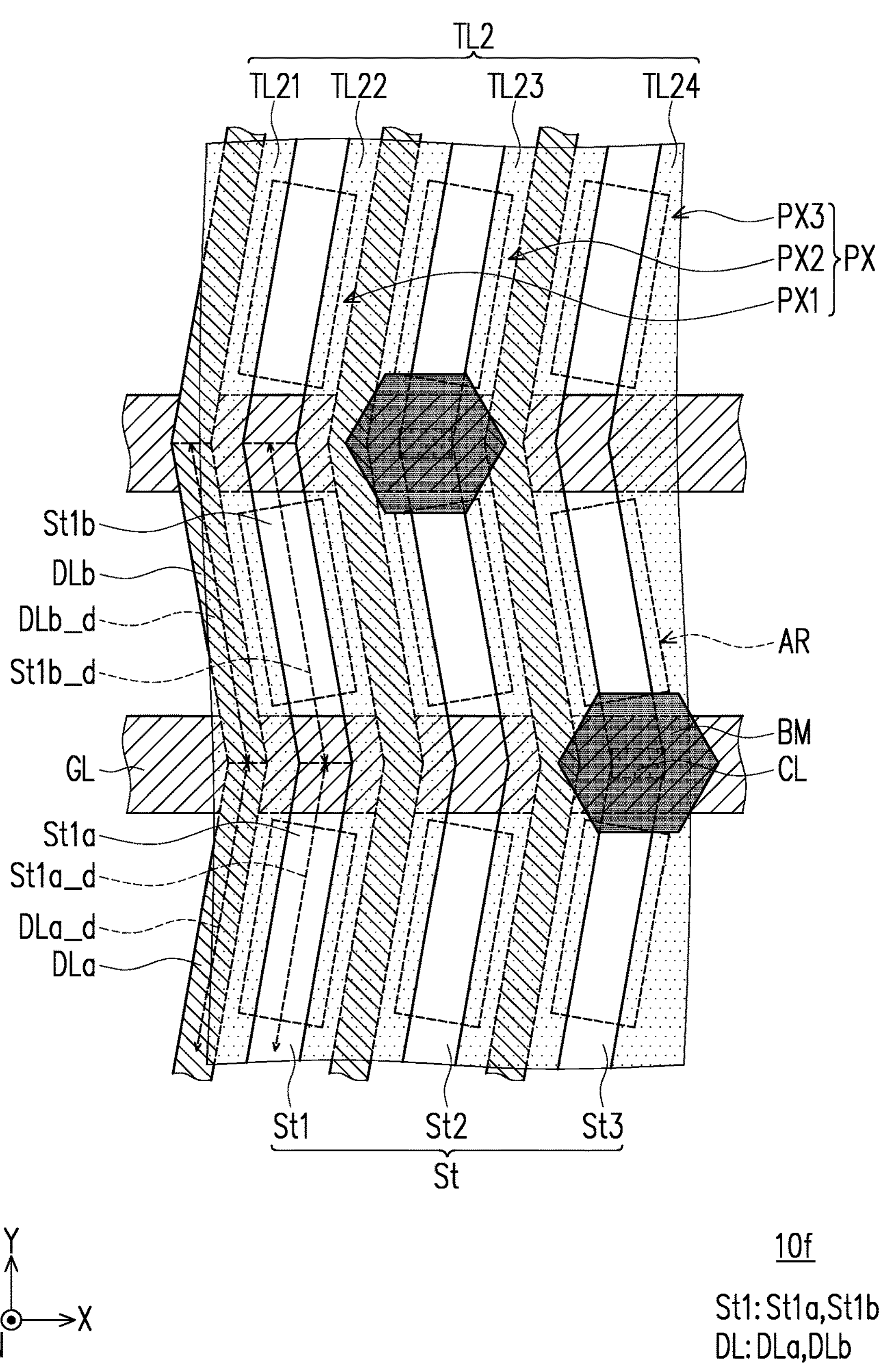
FIG. 6B is a partial top schematic diagram of an electronic device of the sixth embodiment of the disclosure.
Figure 6C:
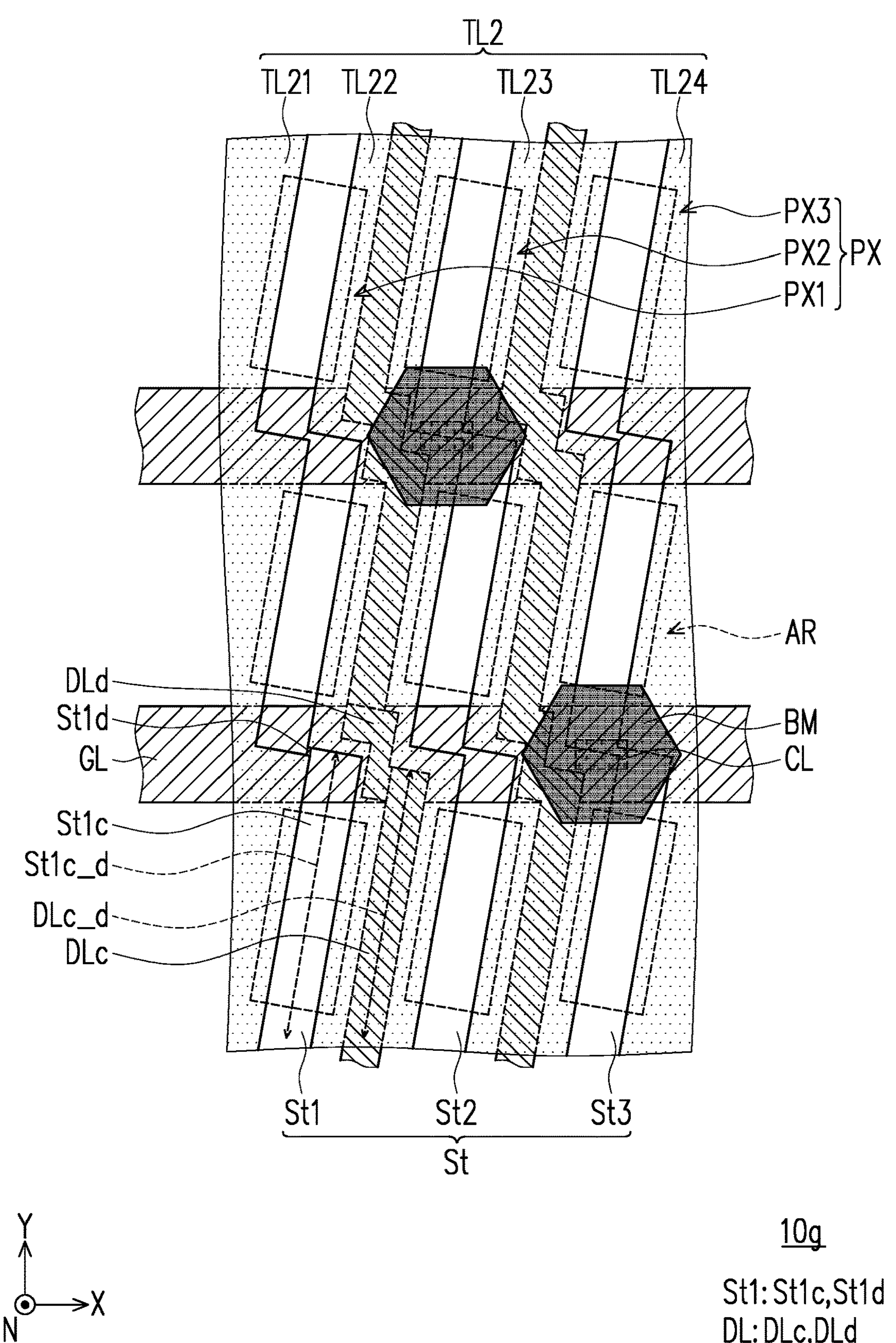
FIG. 6C is a partial top schematic diagram of an electronic device of the seventh embodiment of the disclosure.

FIG. 6A is a partial top schematic diagram of an electronic device of the fifth embodiment of the disclosure, FIG. 6B is a partial top schematic diagram of an electronic device of the sixth embodiment of the disclosure, and FIG. 6C is a partial top schematic diagram of an electronic device of the seventh embodiment of the disclosure. It should be mentioned that, the embodiments of FIG. 6A to FIG. 6C may each adopt the reference numerals of the embodiments of FIG. 1 and FIG. 2 and a portion of the contents thereof, wherein the same or similar reference numerals are used to represent the same or similar elements and descriptions of the same technical contents are omitted.

First, please refer to FIG. 6A. The main difference between an electronic device 10e and the electronic device 10a is that the slit St of the transparent conductive layer TL2 is disposed corresponding to the plurality of sub-pixel structures PX.

In the present embodiment, the transparent conductive layer TL2 includes a slit St1, a slit St2, and a slit St3, and the electronic device 10e includes a first group of sub-pixel structures PX1, a second group of sub-pixel structures PX2, and a third group of sub-pixel structures PX3, wherein the slit St1 is disposed corresponding to the first group of sub-pixel structures PX1, the slit St2 is disposed corresponding to the second group of sub-pixel structures PX2, and the slit St3 is disposed corresponding to the third group of sub-pixel structures PX3.

Specifically, for example, the slit St1, the slit St2, and the slit St3 are each extended in the second direction Y, and each corresponds to the first group of sub-pixel structures PX1, the second group of sub-pixel structures PX2, and the third group of sub-pixel structures PX3 arranged along the second direction Y, wherein although FIG. 6A shows that the number of sub-pixel structures included in each of the first group of sub-pixel structures PX1, the second group of sub-pixel structures PX2, and the third group of sub-pixel structures PX3 is 3, the disclosure is not limited thereto.

Moreover, from another perspective, as shown in FIG. 6A, the arrangement of the slit St1, the slit St2, and the slit St3 divides the transparent conductive layer TL2 into a transparent conductive pattern TL21, a transparent conductive pattern TL22, a transparent conductive pattern TL23, and a transparent conductive pattern TL24, for example. Accordingly, in the present embodiment, the electronic device 10e further includes a connecting electrode CL, wherein the connecting electrode CL may electrically connect adjacent transparent conductive patterns to each other. For example, the connecting electrode CL may be used to electrically connect the adjacent transparent conductive pattern TL22 and transparent conductive pattern TL23, but the disclosure is not limited thereto. The material of the connecting electrode CL may include, for example, a metal material or a metal oxide conductive material, but the disclosure is not limited thereto. In some embodiments, the connecting electrode CL may be covered by the second light-shielding layer BM in the normal direction N of the substrate SB1 to reduce the possibility that the connecting electrode CL is seen by the user.

Next, please refer to FIG. 6B. The main difference between an electronic device 10f and the electronic device 10e is that the slit St includes a plurality of portions having different extending directions.

Specifically, taking the slit St1 as an example, the slit St1 includes a first portion St1a and a second portion St1b, wherein the first portion St1a has an extending direction St1a_d, and the second portion St1b has an extending direction St1b_d. Similarly, the slit St2 and the slit St3 may also include a first portion and a second portion, which is not described again.

In some embodiments, taking the slit St1 as an example, there may be an included angle less than or equal to 20° between the extending direction St1a_d of the first portion St1a and the extending direction St1b_d of the second portion St1b (0°<the included angle between the extending direction St1a_d of the first portion St1a and the extending direction St1b_d of the second portion) St1b≤20°, but the disclosure is not limited thereto.

In order to reduce the phenomenon that the above design of the slit St causes dark lines in the electronic device 10f, in the present embodiment, the data line DL also includes the first portion DLa and the second portion DLb correspondingly, wherein the first portion DLa has the extending direction DLa_d, and the second portion DLb has the extending direction DLb_d.

In some embodiments, there may also be an included angle less than or equal to 20° between the extending direction DLa_d of the first portion DLa and the extending direction DLb_d of the second portion DLb (0°<the included angle between the extending direction DLa_d of the first portion DLa and the extending direction DLb_d of the second portion) DLb≤20°, but the disclosure is not limited thereto.

Although not shown in FIG. 6B, the first light-shielding layer MSL overlapped with the data line DL may also include a first portion and a second portion correspondingly, which is not described again.

Next, please refer to FIG. 6C. The main difference between an electronic device 10g and the electronic device 10e is that the slit St includes a plurality of portions having the same extending direction.

Specifically, taking the slit St1 as an example, the slit St1 includes a plurality of portions St1c, wherein the plurality of portions St1c have the same extending direction St1c_d, and adjacent portions St1c are connected to each other via a connecting section St1d. Similarly, the slit St2 and the slit St3 may also include a plurality of portions having the same extending direction, which is not described again.

In some embodiments, taking the slit St1 as an example, there may be an included angle less than or equal to 20° between the extending direction St1c_d of the plurality of portions St1c and the second direction Y (0°<the included angle between the extending direction St1c_d of the plurality of portions St1c and the second direction) Y≤20°, but the disclosure is not limited thereto.

In order to reduce the phenomenon that the above design of the slit St causes dark lines in the electronic device 10g, in the present embodiment, the data line DL also correspondingly includes a plurality of portions DLc having the same extending direction, wherein the plurality of portions DLc have the same extending direction DLc_d, and adjacent portions DLc are connected to each other via a connecting section DLd.

In some embodiments, there may be an included angle less than or equal to 20° between the extending direction DLc_d of the plurality of portions DLc and the second direction Y (0°<the included angle between the extending direction DLc_d of the plurality of portions DLc and the second direction) Y≤20°, but the disclosure is not limited thereto.

Although not shown in FIG. 6C, the first light-shielding layer MSL overlapped with the data line DL may also include a plurality of portions having the same extending direction, which is not described again.

Figure 7:
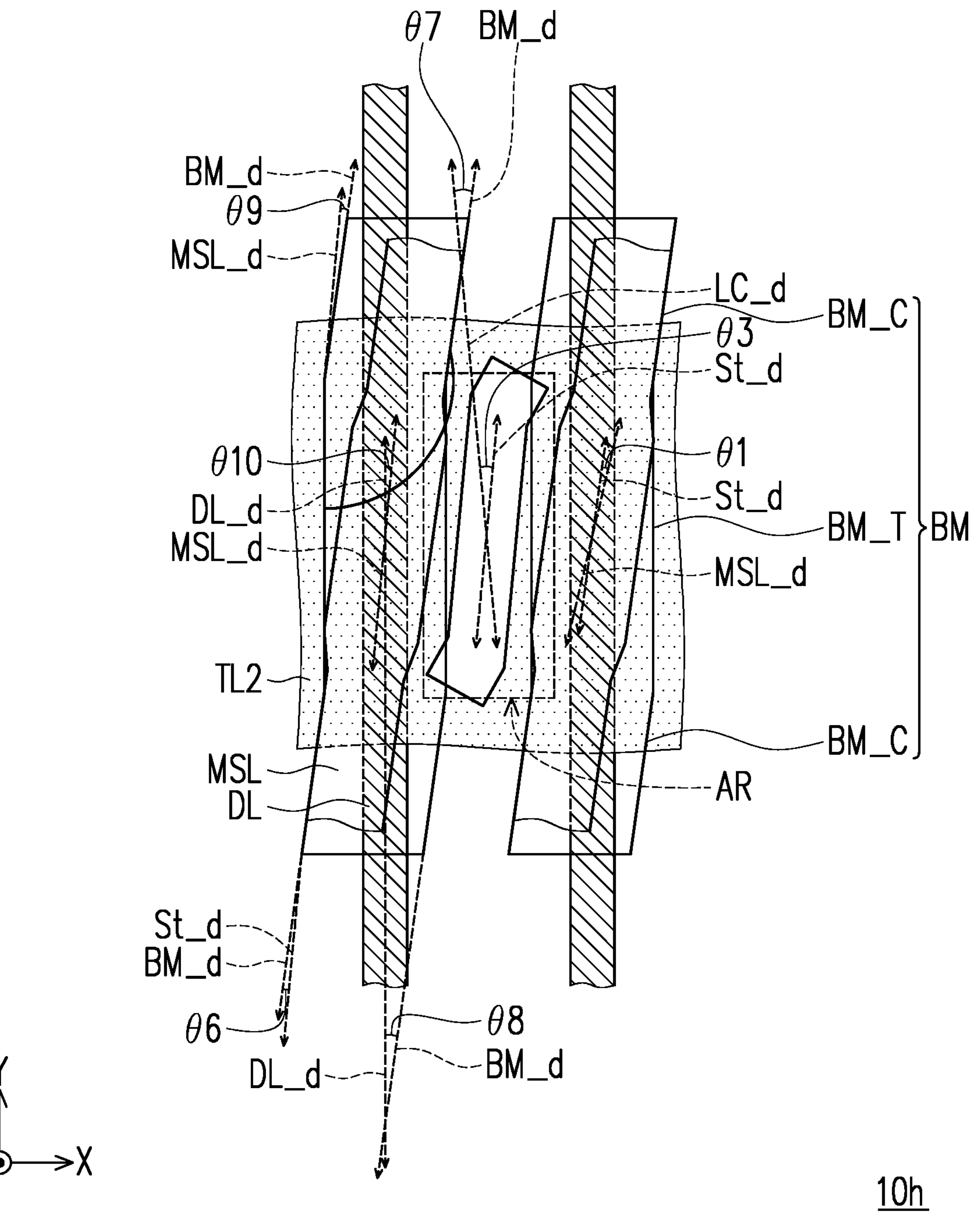
FIG. 7 is a partial top schematic diagram of an electronic device of the eighth embodiment of the disclosure.

FIG. 7 is a partial top schematic diagram of an electronic device of the eighth embodiment of the disclosure. It should be mentioned that, the embodiment of FIG. 7 may adopt the reference numerals of the embodiments of FIG. 1 and FIG. 2 and a portion of the contents thereof, wherein the same or similar reference numerals are used to represent the same or similar elements and descriptions of the same technical contents are omitted.

Referring to FIG. 7, the main difference between an electronic device 10*h* and the electronic device 10*a* is that the second light-shielding layer BM is disposed corresponding to the slit St of the transparent conductive layer TL2.

Specifically, in order to reduce the phenomenon that the design of the slit St having the corner portion St_C causes dark lines in the electronic device 10*h*, in the present embodiment, the second light-shielding layer BM also includes a trunk portion BM_T and a corner portion BM_C correspondingly, wherein the extending direction of the trunk portion BM_T may be substantially the same as the extending direction MSL_d of the trunk portion of the first light-shielding layer MSL, the corner portion BM_C has an extending direction BM_d, and there may be a non-zero included angle between the extending direction BM_d of the corner portion BM_C and the extending direction of the trunk portion BM_T.

In order to achieve similar effects as mentioned above, in the present embodiment, the first light-shielding layer MSL may also include a trunk portion and a corner portion accordingly, which is not described again.

In the present embodiment, the extending direction BM_d of the corner portion BM_C of the second light-shielding layer BM and (1) the extending direction St_d of the trunk portion St_T of the slit St; (2) the alignment direction LC_d of the dielectric layer LC; (3) the extending direction DL_d of the data line DL; and (4) the extending direction MSL_d of the trunk portion of the first light-shielding layer MSL may have the following relationship.

(1) In the present embodiment, there is an angle θ6 between the extending direction BM_d of the corner portion BM_C of the second light-shielding layer BM and the extending direction St_d of the trunk portion St_T of the slit St, and the included angle θ6 satisfies the following relationship: $0° \leq θ6 \leq 20°$. In some other embodiments, the included angle θ6 may satisfy the following relationship: $0° \leq θ6 \leq 15°$.

(2) In the present embodiment, there is an included angle θ7 between the extending direction BM_d of the corner portion BM_C of the second light-shielding layer BM and the alignment direction LC_d of the dielectric layer LC, and the included angle θ7 satisfies the following relationship: $0° \leq θ7 \leq 20°$. In some other embodiments, the included angle θ7 may satisfy the following relationship: $0° \leq θ7 \leq 15°$. It is worth noting that the included angle θ7 is based on the fact that the dielectric in the dielectric layer LC includes positive liquid crystal. In contrast, when the dielectric in the dielectric layer LC includes negative liquid crystal, the included angle θ7 may satisfy the following relationship: $70° \leq θ7 \leq 90°$. In some other embodiments, the included angle θ7 may satisfy the following relationship: $75° \leq θ7 \leq 90°$.

(3) In the present embodiment, there is an included angle θ8 between the extending direction BM_d of the corner portion BM_C of the second light-shielding layer BM and the extending direction DL_d of the data line DL, and the included angle θ8 satisfies the following relationship: $0° \leq θ8 \leq 15°$.

(4) In the present embodiment, there is an angle θ9 between the extending direction BM_d of the corner portion BM_C of the second light-shielding layer BM and the extending direction MSL_d of the trunk portion of the first light-shielding layer MSL, and the included angle θ9 satisfies the following relationship: $0° \leq θ9 \leq 15°$.

Moreover, in the present embodiment, there may be an included angle θ10 between the extending direction DL_d of the data line DL and the extending direction MSL_d of the first light-shielding layer MSL, and the included angle θ10 satisfies the following relationship: $0° \leq θ10 \leq 15°$.

Figure 8A:
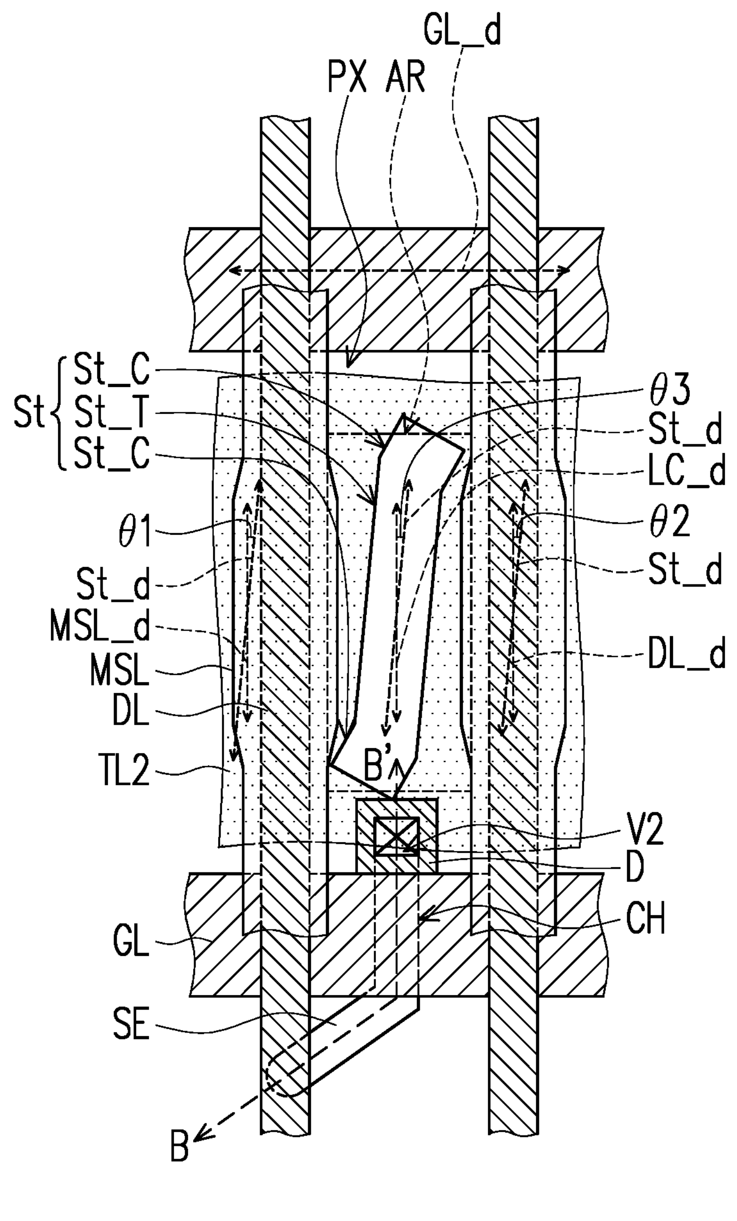
FIG. 8A is a partial top schematic diagram of an electronic device of the ninth embodiment of the disclosure.
Figure 8A:
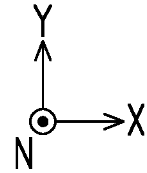
Figure 8B:
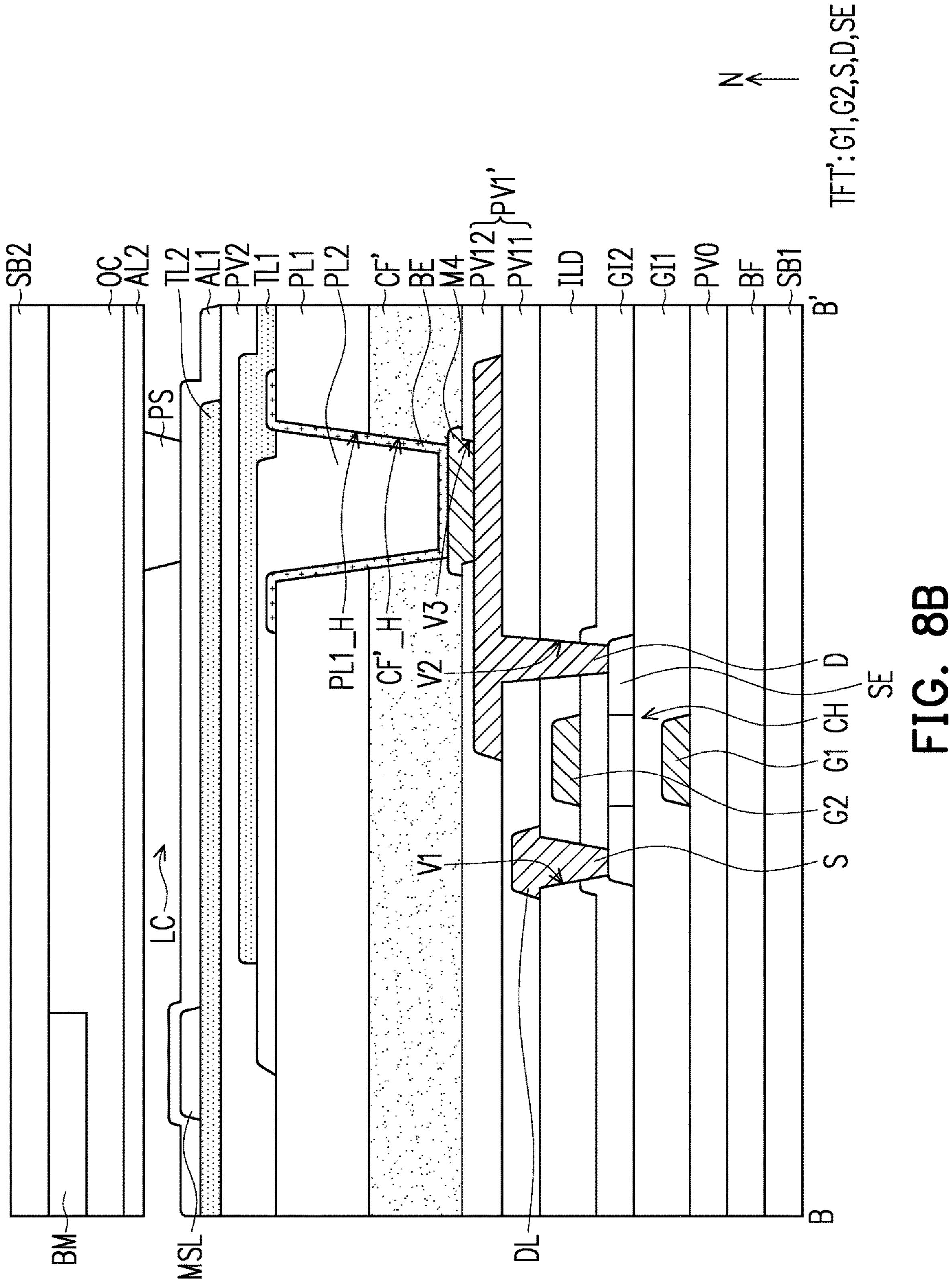
FIG. 8B is a partial cross-sectional schematic diagram of an embodiment according to the cross-section line B-B' of FIG. 8A.

FIG. 8A is a partial top schematic diagram of an electronic device of the ninth embodiment of the disclosure, and FIG. 8B is a partial cross-sectional schematic diagram of an embodiment according to the cross-section line B-B' of FIG. 8A. It should be mentioned that, the embodiments of FIG. 8A and FIG. 8B may each adopt the reference numerals of the embodiments of FIG. 1 and FIG. 2 and a portion of the contents thereof, wherein the same or similar reference numerals are used to represent the same or similar elements and descriptions of the same technical contents are omitted.

Referring to FIG. 8A and FIG. 8B, the main difference between an electronic device 20 and the electronic device 10*a* is that a color filter CF' is disposed between the planar layer PL1 and an active element TFT'.

In the present embodiment, the color filter CF' is located on the substrate SB1, disposed on an insulating layer PV1', and partially covers the conductive layer M4. In detail, the color filter CF' may, for example, have a hole CF'_H, and the hole CF'_H of the color filter CF' may, for example, be connected to the hole PL1_H of the planar layer PL1 to expose a portion of the conductive layer M4 together.

In the present embodiment, the insulating layer PV1' includes an insulating sub-layer PV11 and an insulating sub-layer PV12, wherein the insulating sub-layer PV12 is disposed on the insulating sub-layer PV11. The insulator layer PV11 and the insulator layer PV12 may, for example, have the same or different materials, but the disclosure is not limited thereto.

In the present embodiment, the electronic device 20 includes the active element TFT', a gate insulating layer GI1, a gate insulating layer GI2, and the interlayer insulating layer ILD, wherein the active element TFT' is a double-gate TFT. Specifically, the active element TFT' includes, for example, a gate G1 and a gate G2. The gate G1 is, for example, disposed between the gate insulating layer GI1 and an insulating layer PV0 (which may, for example, include a material similar to the insulating layer PV1), and the gate G2 is, for example, disposed between the gate insulating layer GI2 and the interlayer insulating layer ILD. From another perspective, the gate G1 is, for example, located below the semiconductor layer SE, and the gate G2 is, for example, located above the semiconductor layer SE. In some embodiments, the gate G1 may be at least partially overlapped with the gate G2 to jointly control the channel region CH located between the gate G1 and the gate G2. In the present embodiment, the material of the semiconductor layer SE includes metal oxide, wherein the metal oxide includes indium gallium zinc oxide, but the disclosure is not limited thereto.

In addition, in the present embodiment, the through hole connected to the hole CF'_H and the hole PL1_H is not overlapped with the semiconductor layer SE of the active element TFT', but the disclosure is not limited thereto.

In the present embodiment, the electronic device 20 also includes the conductive layer M4 replacing the conductive layer M3, wherein the conductive layer M4 is disposed on the insulator sub-layer PV12 of the insulating layer PV1', and the through hole V3 of the insulator sub-layer PV12 is electrically connected to the drain D of the active element TFT'. In some embodiments, the conductive layer M4 may be used to electrically connect the active element TFT' and the transparent conductive layer TL1, but the disclosure is not limited thereto. The material of the conductive layer M4 may include metal, metal oxide, other suitable materials, or a combination thereof, but the disclosure is not limited thereto. However, in other embodiments, the electronic device 20 may omit the conductive layer M4, and the insulating layer PV1' may include a plurality of sub-layers (i.e., the insulating layer PV1 of the above embodiment). In this case, the bridge electrode BE may, for example, be directly electrically connected to the drain D of the active element TFT'. In the present embodiment, the drain D may include any suitable transparent conductive material, such as indium tin oxide (ITO), but the disclosure is not limited thereto.

In addition, in the present embodiment, the first light-shielding layer MSL is disposed above the transparent conductive layer TL1, but the disclosure is not limited thereto.

Based on the above, in the electronic device provided by some embodiments of the disclosure, by making the included angle (θ1) between the extending direction of the trunk portion of the slit and the extending direction of the first light-shielding layer satisfy the relationship: 0°≤θ1≤20°, when the resulting first light-shielding layer and/or transparent conductive layer is offset or the resulting first light-shielding layer and/or transparent conductive layer has unexpected dimensions, the possibility of the electronic device producing significant dark lines may be reduced to increase the penetration rate of the electronic device. Accordingly, the electronic device provided by some embodiments of the disclosure may have relatively good display quality and/or may reduce the power consumption of the backlight module in the electronic device provided by some embodiments of the disclosure.

What is claimed is:

1. An electronic device, comprising:

a substrate;

a data line disposed on the substrate;

a transparent conductive layer disposed on the data line and having a slit, wherein the slit has a trunk portion, and the trunk portion is extended in a first direction;

a first light-shielding layer disposed on the data line and overlapped with the data line; and a second light-shielding layer disposed on the first light-shielding layer, wherein the first light-shielding layer is extended in a second direction, there is a first included angle between the first direction and the second direction, and the first included angle satisfies a following relationship: 0°≤θ1≤20°, wherein θ1 is the first included angle.

2. The electronic device of claim 1, wherein a material of the first light-shielding layer comprises a metal material.

3. The electronic device of claim 1, further comprising a dielectric layer, and the dielectric layer is disposed between the first light-shielding layer and the second light-shielding layer and has an alignment direction, wherein there is a second included angle between the second direction and the alignment direction, and the second included angle satisfies a following relationship: 0°≤θ5≤20°, wherein θ5 is the second included angle.

4. The electronic device of claim 3, wherein a portion of the second light-shielding layer is overlapped with the first light-shielding layer, and the portion of the second light-shielding layer is extended in a third direction, wherein there is a third included angle between the third direction and the alignment direction, and the third included angle satisfies a following relationship: 0°≤θ7≤20°, wherein θ7 is the third included angle.

5. The electronic device of claim 4, wherein a material of the second light-shielding layer comprises a black resin.

6. The electronic device of claim 4, wherein there is a fourth included angle between the second direction and the third direction, and the fourth included angle satisfies a following relationship: 0°≤θ9≤15°, wherein θ9 is the fourth included angle.

7. The electronic device of claim 1, further comprising a gate line, wherein an adjacent gate line and an adjacent data line define a sub-pixel structure, the transparent conductive layer comprises a plurality of slits, and one in the plurality of slits is disposed corresponding to a plurality of the sub-pixel structure.

8. The electronic device of claim 7, wherein the transparent conductive layer comprises a plurality of transparent conductive patterns, and adjacent transparent conductive patterns are electrically connected to each other via a connecting electrode.

9. The electronic device of claim 8, wherein the connecting electrode is covered by the second light-shielding layer.

10. The electronic device of claim 1, wherein there is a fifth included angle between an extending direction of the data line and the second direction in which the first light-shielding layer is extended, and the fifth included angle satisfies a following relationship: 0°≤θ10≤15°, wherein θ10 is the fifth included angle.

11. The electronic device of claim 1, wherein there is a sixth included angle between the first direction and an extending direction of the data line, and the sixth included angle satisfies a following relationship: 0°≤θ2≤20°, wherein θ2 is the sixth included angle.

12. The electronic device of claim 3, wherein there is a seventh included angle between the alignment direction and the first direction, and the seventh included angle satisfies a following relationship: 0°≤θ3≤20°, wherein θ3 is the seventh included angle.

13. The electronic device of claim 3, wherein there is an eighth included angle between the alignment direction and an extending direction of the data line, and the eighth included angle satisfies a following relationship: 0°≤θ4≤20°, wherein θ4 is the eighth included angle.

14. The electronic device of claim 1, wherein the second light-shielding layer has a corner portion, there is a ninth included angle between an extending direction of the corner portion of the second light-shielding layer and the first direction, and the ninth included angle satisfies a following relationship: 0°≤θ6≤20°, wherein θ6 is the ninth included angle.

15. The electronic device of claim 14, wherein there is a tenth included angle between the extending direction of the corner portion of the second light-shielding layer and an extending direction of the data line, and the tenth included angle satisfies a following relationship: 0°≤θ8≤15°, wherein θ8 is the tenth included angle.

16. The electronic device of claim 1, wherein the data line has a first portion and a second portion extended indifferent directions.

17. The electronic device of claim 16, wherein an included angle between an extending direction of the first portion of the data line and an extending direction of the second portion of the data line is less than or equal to 20°.

18. The electronic device of claim 1, wherein the slit has a first portion and a second portion extended indifferent directions.

19. The electronic device of claim 18, wherein an included angle between an extending direction of the first portion of the slit and an extending direction of the second portion of the slit is less than or equal to 20°.

20. The electronic device of claim 1, wherein the slit has a plurality of portions extended in a same direction, and adjacent portions in the plurality of portions are connected to each other via a connecting section.

* * * * *